(12) United States Patent
Hayashi (10) Patent No.: US 11,632,104 B2
(45) Date of Patent: Apr. 18, 2023

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventor: Tsuneyuki Hayashi, Kodaira (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/650,294

(22) Filed: Feb. 8, 2022

(65) Prior Publication Data

US 2023/0046420 A1  Feb. 16, 2023

(30) Foreign Application Priority Data

Aug. 12, 2021 (JP) .............................. JP2021-131590

(51) Int. Cl.
*H03K 5/24* (2006.01)
*H03K 17/687* (2006.01)

(52) U.S. Cl.
CPC ....... *H03K 5/2472* (2013.01); *H03K 17/6871* (2013.01)

(58) Field of Classification Search
CPC .................... H03K 5/2472; H03K 17/6871
See application file for complete search history.

(56) References Cited

U.S. PATENT DOCUMENTS

| 9,088,053 B2 | 7/2015 | Suzuki |
| 2007/0126482 A1* | 6/2007 | Khan. P ............... H03K 5/2472 327/77 |
| 2013/0176058 A1 | 7/2013 | Iwasa |

FOREIGN PATENT DOCUMENTS

| JP | 2000-341097 A | 12/2000 |
| JP | 2013-141113 A | 7/2013 |
| JP | 2016-27336 A | 2/2016 |

* cited by examiner

*Primary Examiner* — Metasebia T Retebo
(74) *Attorney, Agent, or Firm* — Allen & Overy LLP (57) ABSTRACT

According to one embodiment, a semiconductor device includes a first switch element including a first end to which a first voltage is applied, and a second end and a gate electrically coupled to a first node, a second switch element including a first end to which a second voltage is applied, and a second end and a gate electrically coupled to the first node, a third switch element including a first end to which the second voltage is applied, a second end electrically coupled to a second node, and a gate coupled to the first node, a fourth switch element including a gate coupled to the second node, and a first terminal electrically coupled to a first end of the fourth switch element and outputting a signal based on a voltage of the second node.

26 Claims, 8 Drawing Sheets

SEMICONDUCTOR DEVICE

CROSS-REFERENCE TO RELATED APPLICATIONS

This application is based upon and claims the benefit of priority from Japanese Patent Application No. 2021-131590, filed Aug. 12, 2021, the entire contents of which are incorporated herein by reference.

FIELD

Embodiments described herein relate generally to a semiconductor device.

BACKGROUND

A semiconductor device for comparing heights of two voltages and outputting a signal based on a result of the comparison is known.

DETAILED DESCRIPTION

In general, according to one embodiment, a semiconductor device includes a first switch element including a first end to which a first voltage is applied, and a second end and a gate electrically coupled to a first node, a second switch element including a first end to which a second voltage is applied, and a second end and a gate electrically coupled to the first node, a third switch element including a first end to which the second voltage is applied, a second end electrically coupled to a second node, and a gate coupled to the first node, a first current source electrically coupled to the first node, a first element electrically coupled to the second node, a fourth switch element including a gate coupled to the second node, and a first terminal electrically coupled to a first end of the fourth switch element and outputting a signal based on a voltage of the second node.

Hereinafter, an embodiment will be described with reference to the drawings. In the descriptions below, constituent elements having the same functions and configurations will be denoted by common reference signs.

1. Embodiment

A semiconductor device according to an embodiment will be described.

1.1 Configuration

A configuration of the semiconductor device according to the embodiment will be described.

1.1.1 Overall Configuration of Semiconductor Device

Figure 1:
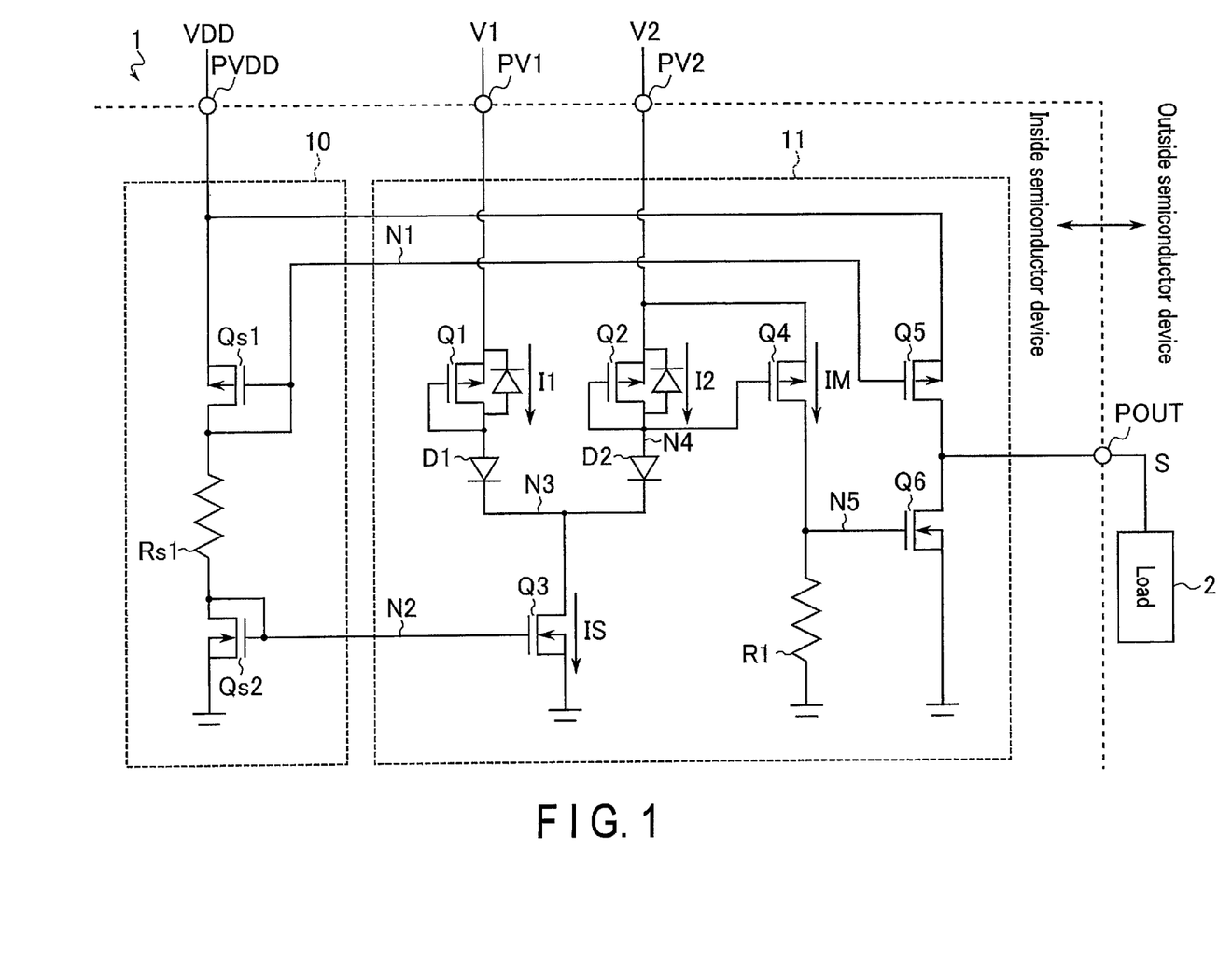
FIG. 1 is a circuit diagram explaining an example of a configuration of a semiconductor device according to an embodiment.

The configuration of the semiconductor device according to the embodiment will be described with reference to FIG. 1. FIG. 1 is a circuit diagram explaining an example of the configuration of the semiconductor device according to the embodiment.

A semiconductor device 1 is, for example, an IC (Integrated Circuit) chip. The semiconductor device 1 includes a current source 10 and a comparing part 11. The current source 10 and the comparing part 11 are provided on a top surface of one substrate. In addition, the semiconductor device 1 includes terminals PVDD, PV1, PV2, and POUT. Voltages VDD, V1, and V2 are applied to the terminals PVDD, PV1, and PV2, respectively, from an external power supply (not shown) of the semiconductor device 1. From the terminal POUT, a signal S is output to a load 2 provided outside the semiconductor device 1. The voltage VDD is a voltage used to drive the semiconductor device 1. The voltages V1 and V2 are voltages to be compared in the semiconductor device 1. The signal S is a signal based on a comparison result of the voltages V1 and V2.

The comparing part 11 is a circuit that compares the heights of the voltages V1 and V2.

The current source 10 is a circuit that supplies an electric current based on the voltage VDD to the comparing part 11.

1.1.2 Configuration of Circuit of Semiconductor Device

Configurations of the circuits of the semiconductor device 1 according to the embodiment will be described with reference to FIG. 1 again.

1.1.2.1 Current Source

First, a configuration of the circuit of the current source 10 will be described.

The current source 10 includes switch elements Qs1 and Qs2, and a resistor Rs1. The switch element Qs1 is a P-channel type MOSFET (Metal-Oxide-Semiconductor Field Effect Transistor). The switch element Qs2 is an N-channel type MOSFET.

The voltage VDD is applied to the source of the switch element Qs1 via the terminal PVDD. The drain and gate of the switch element Qs1 are coupled to a node N1. An electric current based on the voltage VDD flows through the switch element Qs1.

A first end of the resistor Rs1 is coupled to the node N1. A second end of the resistor Rs1 is coupled to a node N2.

The drain and gate of the switch element Qs2 are coupled to the node N2. The source of the switch element Qs2 is grounded. An electric current flowing through the switch element Qs1 is supplied to the switch element Qs2 via the resistor Rs1. That is, an electric current flowing through the switch element Qs2 is based on the voltage VDD.

1.1.2.2 Comparing Part

Next, a configuration of the comparing part 11 according to the embodiment will be described.

The comparing part 11 includes switch elements Q1, Q2, Q3, Q4, Q5, and Q6, a resistor R1, and diodes D1 and D2. The switch elements Q1, Q2, Q4, and Q5 are P-channel type MOSFETs. The switch elements Q3 and Q6 are N-channel type MOSFETs.

The voltage V1 is applied to the source of the switch element Q1 via the terminal PV1. The drain and gate of the switch element Q1 are coupled in common to the diode D1. That is, the diode-coupled switch element Q1 is provided between the terminal PV1 and the diode D1. Thus, the switch element Q1 operates in a saturation region, and an electric current I1 flows through the switch element Q1.

The anode of the diode D1 is coupled to the drain and gate of the switch element Q1. The cathode of the diode D1 is coupled to a node N3.

The voltage V2 is applied to the source of the switch element Q2 via the terminal PV2. The drain and gate of the switch element Q2 are coupled in common to a node N4. That is, the diode-coupled switch element Q2 is provided between the terminal PV2 and the node N4. Thus, the switch element Q2 operates in a saturation region, and an electric current I2 flows through the switch element Q2. A gate length, a channel width, and a current-voltage characteristic of the switch element Q2 are equivalent to those of the switch element Q1.

The anode of the diode D2 is coupled to the node N4. The cathode of the diode D2 is coupled to the node N3. A current-voltage characteristic of the diode D2 is equivalent to that of the diode D1.

The switch element Q3 forms a current mirror circuit with the switch element Qs2 of the current source 10. The drain of the switch element Q3 is coupled to the node N3. The source of the switch element Q3 is grounded. The gate of the switch element Q3 is coupled to the current source 10 via the node N2. A constant current IS flows through the switch element Q3, with the operation of the current source 10. The constant current IS is a sum of the electric currents I1 and I2.

The switch element Q4 forms a current mirror circuit with the switch element Q2. That is, the source of the switch element Q4 is coupled to the terminal PV2. The drain of the switch element Q4 is coupled to a node N5. The gate of the switch element Q4 is coupled to the node N4. An electric current IM flows through the switch element Q4. Herein, a gate length, a channel width, and a current-voltage characteristic of the switch element Q4 are equivalent to those of the switch element Q2. Thereby, the electric current IM is a mirror current of the electric current I2.

The switch element Q5 forms a current mirror circuit with the switch element Qs1 of the current source 10. That is, the voltage VDD is applied to the source of the switch element Q5 via the terminal PVDD. The drain of the switch element Q5 is coupled to the terminal POUT. The gate of the switch element Q5 is coupled to the current source 10 via the node N1. A constant current flows through the switch element Q5, with the operation of the current source 10.

The drain of the switch element Q6 is coupled to the terminal POUT. The source of the switch element Q6 is grounded. The gate of the switch element Q6 is coupled to the node N5. A threshold voltage of the switch element Q6 is equivalent to a voltage of the node N5 in a case where the electric current IM is equal to a half of the constant current IS. That is, in a case where the electric current IM is equal to or larger than a half of the constant current IS, the switch element Q6 is turned on. In addition, in a case where the electric current IM is smaller than a half of the constant current IS, the switch element Q6 is turned off.

A first end of the resistor R1 is coupled to the node N5. A second end of the resistor R1 is grounded.

Note that the constant current IS flowing through the switch element Q3 is such that a gate-source voltage of the switch element Q1 in a case where the electric current I1 is almost equal to the constant current IS (a case where the electric current I2 rarely flows) is lower than a rating voltage RVGS1 of the switch element Q1. In addition, the constant current IS is such that a gate-source voltage of the switch element Q2 in a case where the electric current I2 is almost equal to the constant current IS (a case where the electric current I1 rarely flows) is lower than a rating voltage RVGS2 of the switch element Q2. The semiconductor device 1 is formed such that such a constant current IS flows through the switch element Q3.

1.2 Operation

An operation using the semiconductor device 1 according to the embodiment will be described.

In the operation using the semiconductor device 1, the voltage VDD is applied to the terminal PVDD. Thereby, constant currents based on the voltage VDD respectively flow through the switch elements Q3 and Q5 of the comparing part 11.

In addition, the voltages V1 and V2 are applied to the terminals PV1 and PV2, respectively. Thereby, the electric currents I1 and I2 flow through the switch elements Q1 and Q2, respectively.

In a case where the voltage V1 is higher than the voltage V2, the electric current I1 is larger than a half of the constant current IS (IS/2), and the electric current I2 is smaller than a half of the constant current IS. In addition, in a case where the voltage V1 is equal to or lower than the voltage V2, the electric current I1 is equal to or smaller than a half of the constant current IS, and the electric current I2 is equal to or larger than a half of the constant current IS.

With the operation of the current mirror circuit including the switch elements Q2 and Q4, an electric current IM equal to the electric current I2 flows through the switch element Q4. That is, in a case where the voltage V1 is higher than the voltage V2, the electric current IM is smaller than a half of the constant current IS. In addition, in the case where the voltage V1 is equal to or lower than the voltage V2, the electric current IM is equal to or larger than a half of the constant current IS.

As described above, the voltage of the node N5 is formed so as to be equal to the threshold voltage of the switch element Q6 in the case where the electric current IM is equal to a half of the constant current IS. Thereby, in the case where the voltage V1 is higher than the voltage V2, the switch element Q6 is turned off. Thus, the voltage VDD is supplied to the terminal POUT via the switch element Q5, and an "H"-level signal S is output from the terminal POUT. In addition, in the case where the voltage V1 is equal to or lower than the voltage V2, the switch element Q6 is turned on. Thus, the terminal POUT is grounded via the switch element Q6, and an "L"-level signal S is output from the terminal POUT.

1.3 Advantageous Effect of Present Embodiment

According to the embodiment, it is possible to suppress an increase in chip size while suppressing an increase in power consumption. An advantageous effect of the embodiment will be described below.

The semiconductor device 1 according to the embodiment includes the switch element Q1 including the source to which the voltage V1 is applied and the drain and gate coupled to the node N3, the switch element Q2 including the source to which the voltage V2 is applied and the drain and gate coupled to the node N3, and the switch element Q3 including the drain coupled to the node N3. With such a configuration, each of the electric currents I1 and I2 can be suppressed to currents that are equal to or smaller than the constant current IS. Thus, upper limit values of the gate-source voltages of the switch elements Q1 and Q2 can be set based on the constant current IS, regardless of the heights of the voltages V1 and V2. Thereby, an increase in the gate-source voltages of the switch elements Q1 and Q2 can be suppressed without using a means such as dividing the voltages V1 and V2 using an element such as a resistor. Accordingly, rather than the case of using an element such as a resistor, it is possible to suppress an increase in power consumption as well as an increase in chip size due to increased elements.

Supplementarily, in a case where a gate-source voltage of a switch element corresponding to an electric current flowing through the switch element is not uniquely determined, there is a possibility that the switch element may be destroyed due to the gate-source voltage of the switch element exceeding a rating voltage thereof. As one technique for avoiding such an event, for example, a technique of reducing a voltage to be applied to a switch element by providing an element such as a resistor for dividing a voltage to be applied to the gate or source of the switch element is known. However, according to that technique, there is a possibility that power consumption and a chip size of a semiconductor device may increase due to an increase in the number of elements included in the semiconductor device.

According to the embodiment, regardless of the heights of the voltages V1 and V2 to be applied to the sources of the switch elements Q1 and Q2, the upper limit values of the gate-source voltages of the switch elements Q1 and Q2 can be suppressed to a range lower than the rating voltages RVGS1 and RVGS2 of the switch elements. Thus, the semiconductor device 1 can suppress the destruction of the switch elements Q1 and Q2 even without a means such as dividing the voltages to be compared. Thus, the increase in elements such as resistors can be suppressed. Accordingly, it is possible to suppress an increase in chip size while suppressing an increase in power consumption of the semiconductor device 1.

In addition, in a case where an element such as a resistor for dividing a voltage to be applied to the gate or source of a switch element is included, a semiconductor device includes, for example, a resistor having a large resistance value in order to suppress an increase in current consumption. However, in general, the size of a resistor increases along with an increase in resistance value, leading to an increase in chip size. Thus, suppression of the increase in current consumption and suppression of the increase in chip size would be in a trade-off relationship. According to the embodiment, the increase in resistors can be suppressed. Thus, it is possible to suppress the increase in chip size while suppressing the increase in current consumption that depends on the size of a resistor.

Further, in the case where a resistor for dividing a voltage to be applied to the gate or source of a switch element is included, due to temperature characteristics of the resistor, there is a possibility that current consumption of a semiconductor device may increase depending on the temperature. According to the embodiment, it is possible to suppress the increase in resistors, and it is thus possible to suppress a temperature-dependent increase in current consumption.

In addition, according to the embodiment, the semiconductor device 1 includes the diode D1 including the anode coupled to the drain and gate of the switch element Q1 and the cathode coupled to the node N3, and the diode D2 including the anode coupled to the drain and gate of the switch element Q2 and the cathode coupled to the node N3. That is, an electric current flows in a direction from the switch element Q1 to the node N3 via the diode D1 between the switch element Q1 and the node N3. Between the switch element Q2 and the node N3, an electric current flows in a direction from the switch element Q2 side to the node N3 via the diode D2. Therefore, it is possible to suppress a reverse flow of the electric current from the node N3 to the voltage source of the voltage V1, and a reverse flow of the electric current from the node N3 to a voltage source of the voltage V2.

Supplementarily, in a P-channel type switch element, a body diode is present between the drain and source. The anode of the body diode is coupled to the drain of the corresponding switch element. The cathode of the body diode is coupled to the source of the corresponding switch element. Thereby, in a case where an electric current is supplied to the drain side of the switch element, there is a possibility that the electric current may flow (flow back) from the drain side to the source side of the switch element via the body diode of the switch element. According to the embodiment, the diodes D1 and D2 can suppress a current supply from the node N3 to the drain of the switch element Q1 and a current supply from the node N3 to the drain of the switch element Q2, respectively. Therefore, it is possible to suppress a reverse flow of an electric current via a body diode of the switch element Q1 and a reverse flow of an electric current via a body diode of the switch element Q2.

2. Modifications

The above-described embodiment can be modified in various ways.

Semiconductor devices according to modifications will be described below. In the following, descriptions will be given of configurations and operations of the semiconductor devices according to the modifications, focusing on points different from the semiconductor device according to the embodiment. The semiconductor devices according to the modifications can also exhibit the same effects as that of the embodiment.

2.1 First Modification

Figure 2:
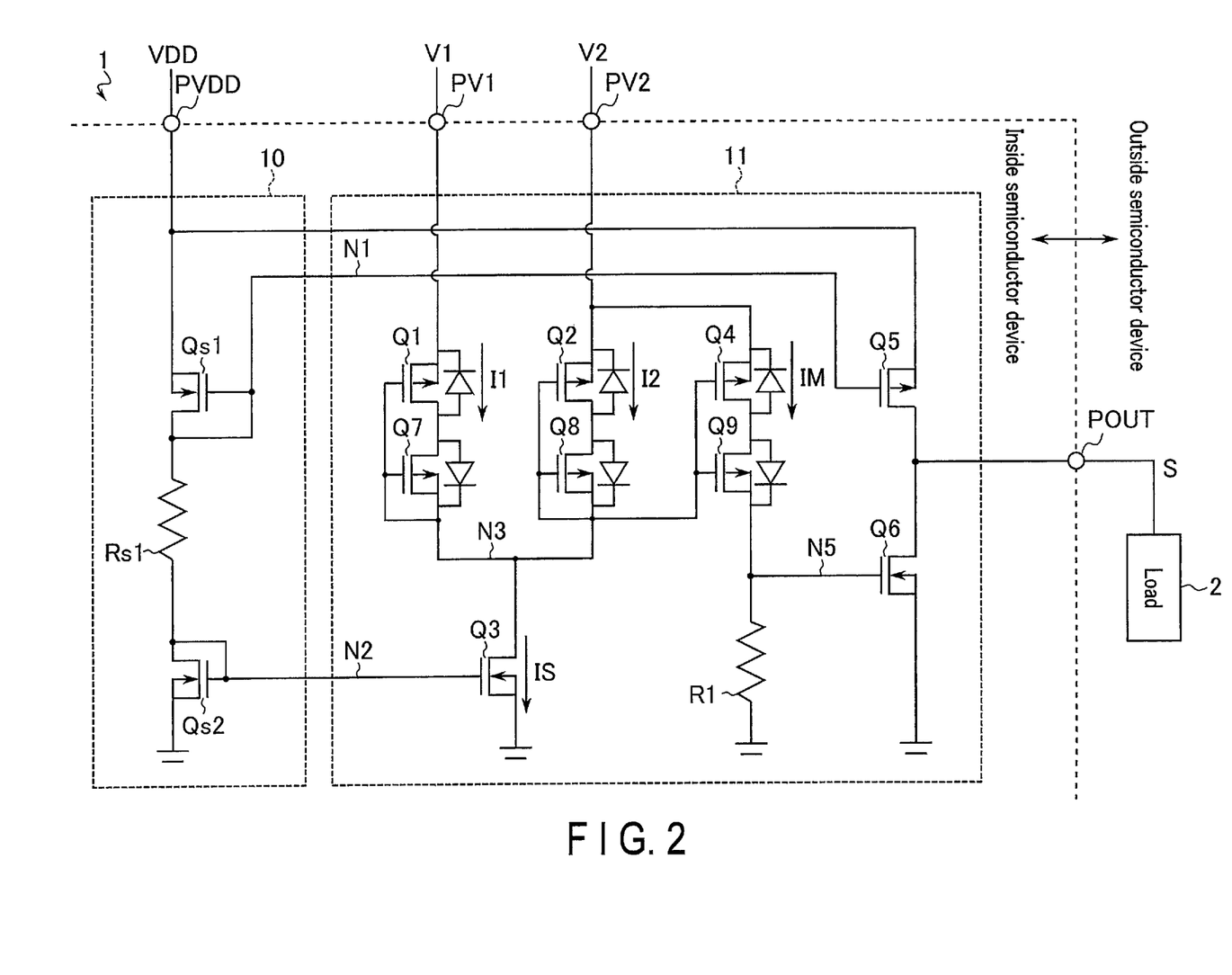
FIG. 2 is a circuit diagram explaining an example of a configuration of a semiconductor device according to a first modification.

In the above-described embodiment, an example has been described in which the diodes D1 and D2 are provided to suppress the reverse flow of the electric current via the switch element Q1 and the reverse flow of the electric current via the switch element Q2, but the present invention is not limited thereto. For example, the reverse flow of the electric current to the voltage source of the voltage V1 and the voltage source of the voltage V2 may be suppressed with a configuration including switch elements instead of the diodes D1 and D2.

A configuration of the semiconductor device 1 according to the first modification will be described with reference to FIG. 2. FIG. 2 is a circuit diagram explaining an example of the configuration of the semiconductor device 1 according to the first modification. Note that since a configuration of the current source 10 of the semiconductor device 1 according to the first modification is the same as that of the embodiment, descriptions thereof will be omitted. In the following, descriptions will be given of a configuration of the comparing part 11 according to the first modification, focusing on points different from the configuration of the comparing part 11 according to the embodiment.

The comparing part 11 according to the first modification includes switch elements Q7, Q8, and Q9. The switch elements Q7, Q8, and Q9 are P-channel type MOSFETs.

The drain of the switch element Q1 is coupled to the switch element Q7. The gate of the switch element Q1 is coupled to the node N3.

The drain of the switch element Q2 is coupled to the switch element Q8. The gate of the switch element Q2 is coupled to the node N3.

The gate of the switch element Q4 is coupled to the node N3. The drain of the switch element Q4 is coupled to the switch element Q9.

The drain of the switch element Q7 is coupled to the drain of the switch element Q1. The source and gate of the switch element Q7 are coupled to the node N3.

The drain of the switch element Q8 is coupled to the drain of the switch element Q2. The source and gate of the switch element Q8 are coupled to the node N3.

The drain of the switch element Q9 is coupled to the drain of the switch element Q4. The source of the switch element Q9 is coupled to the node N5. The gate of the switch element. Q9 is coupled to the node N3.

The rest of the configuration is substantially the same as the configuration of the comparing part 11 according to the embodiment, except that the diodes D1 and D2 are not included.

Since the operation according to the first modification is substantially the same as that according to the embodiment, descriptions thereof will be omitted.

According to the first modification, the switch element Q7 is arranged in such a manner that an orientation of a body diode of the switch element Q7 is different from that of the body diode of the switch element Q1 on a current path between the terminal PV1 and the node N3. In addition, the switch element Q8 is arranged in such a manner that an orientation of a body diode of the switch element Q8 is opposed to an orientation of the body diode of the switch element Q2 on a current path between the terminal PV2 and the node N3. Further, the switch element Q9 is arranged in such a manner that an orientation of a body diode of the switch element Q9 is different from that of a body diode of the switch element Q4 on a current path between the terminal PV2 and the node N5. With such a configuration as well, it is possible to suppress the reverse flow of the electric current to the voltage source of the voltage V1 or the voltage source of the voltage V2, as in the embodiment.

Further, according to the first modification, it is possible to suppress a voltage drop due to a forward voltage of a diode. Thereby, for example, it is possible to suppress a drop in voltage of the node N3 and increase the constant current IS as compared with the case in which the diode is included. Therefore, it is possible to suppress a decrease in reliability of the comparing part 11.

2.2 Second Modification

Figure 3:
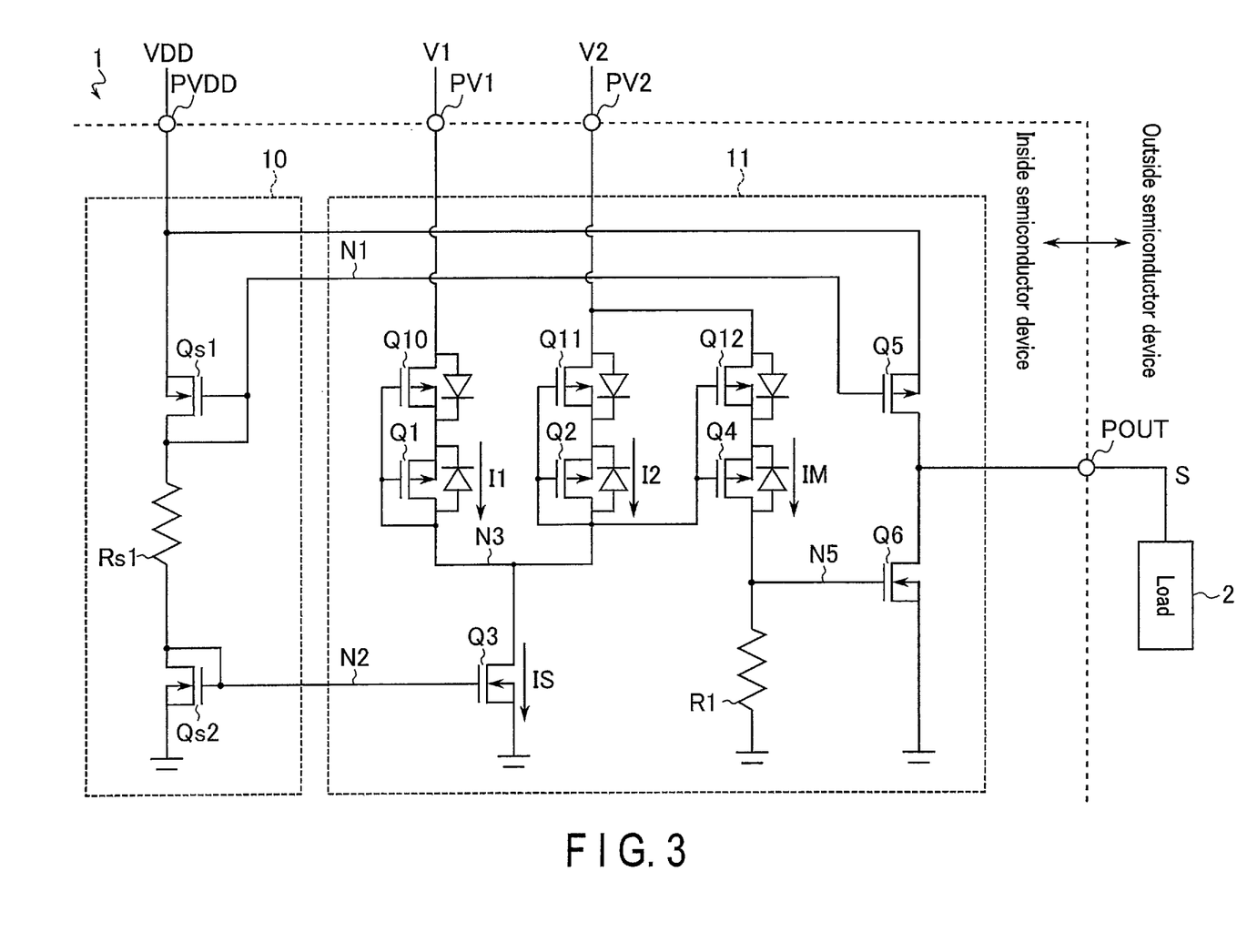
FIG. 3 is a circuit diagram explaining an example of a configuration of a semiconductor device according to a second modification.

In the first modification, a case has been described in which the drain of the switch element Q1, the drain of the switch element Q2, and the drain of the switch element Q4 are respectively coupled to the drains of the corresponding switch elements, but the present invention is not limited thereto. The comparing part 11 may be formed in such a manner that the source of the switch element Q1, the source of the switch element Q2, and the source of the switch element Q4 are respectively coupled to the sources of the corresponding switch elements.

A configuration of the semiconductor device 1 according to a second modification will be described with reference to FIG. 3. FIG. 3 is a circuit diagram explaining an example of the configuration of the semiconductor device 1 according to the second modification. Note that since a configuration of the current source 10 of the semiconductor device 1 according to the second modification is the same as that of the embodiment, descriptions thereof will be omitted. In the following, descriptions will be given of a configuration of the comparing part 11 according to the second modification, focusing on points different from the configuration of the comparing part 11 according to the embodiment.

The comparing part 11 according to the second modification includes switch elements Q10, Q11, and Q12. The switch elements Q10, Q11, and Q12 are P-channel type MOSFETs.

The source of the switch element Q1 is coupled to the switch element Q10. The gate and drain of the switch element Q1 are coupled to the node N3.

The source of the switch element Q2 is coupled to the switch element Q11. The gate and drain of the switch element Q2 are coupled to the node N3.

The source of the switch element Q4 is coupled to the switch element Q12. The gate of the switch element Q4 is coupled to the node N3. The drain of the switch element Q4 is coupled to the node N5.

The source of the switch element Q10 is coupled to the source of the switch element Q1. The drain of the switch element Q10 is coupled to the terminal PV1. The gate of the switch element Q10 is coupled to the node N3.

The source of the switch element Q11 is coupled to the source of the switch element Q2. The drain of the switch element Q11 is coupled to the terminal PV2. The gate of the switch element Q11 is coupled to the node N3.

The source of the switch element Q12 is coupled to the source of the switch element Q4. The drain of the switch element Q12 is coupled to the terminal PV2. The gate of the switch element Q12 is coupled to the node N3.

The rest of the configuration is substantially the same as the configuration of the comparing part 11 according to the embodiment, except that the diodes D1 and D2 are not included.

Since the operation according to the second modification is substantially the same as that according to the embodiment and that according to the first modification, descriptions thereof will be omitted.

With such a configuration as well, it is possible to suppress the reverse flow of the electric current to the voltage source of the voltage V1 or the voltage source of the voltage V2, as in the embodiment and the first modification. In addition, it is possible to suppress a decrease in reliability of the comparing part 11, as in the first modification.

2.3 Third Modification

Figure 4:
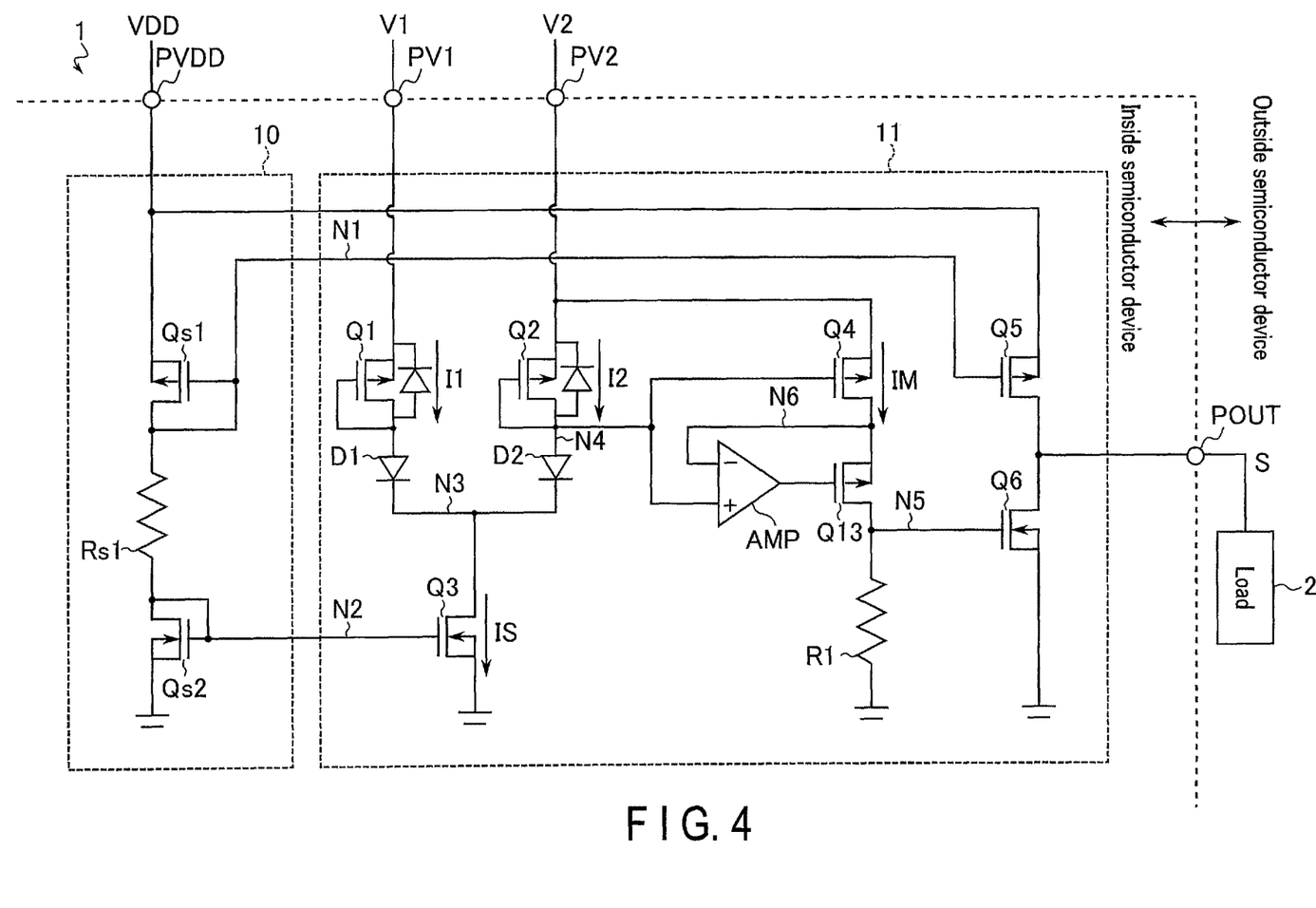
FIG. 4 is a circuit diagram explaining an example of a configuration of a semiconductor device according to a third modification.

In the above-described embodiment, a case has been described in which the gate and drain of the switch element Q2 and the gate of the switch element Q4 are equipotential, but the present invention is not limited thereto. The comparing part 11 may include a configuration of controlling the drain of the switch element Q4, in addition to the gate of the switch element Q4, to be equipotential to the gate and drain of the switch element Q2.

A configuration of the semiconductor device 1 according to a third modification will be described with reference to FIG. 4. FIG. 4 is a circuit diagram explaining an example of the configuration of the semiconductor device 1 according to the third modification. Note that since a configuration of the current source 10 of the semiconductor device 1 according to the third modification is the same as that of the embodiment, descriptions thereof will be omitted. In the following, descriptions will be given of a configuration of the comparing part 11 according to the third modification, focusing on points different from the configuration of the comparing part 11 according to the embodiment.

The comparing part 11 according to the third modification includes an operational amplifier AMP and a switch element Q13. The switch element Q13 is a P-channel type MOSFET.

An inverting input terminal (−) of the operational amplifier AMP is coupled to a node N6. The node N6 is coupled to the drain of the switch element Q4. A non-inverting input terminal (+) of the operational amplifier AMP is coupled to the node N4. An output terminal of the operational amplifier AMP is coupled to the switch element Q13.

The source of the switch element Q13 is coupled to the inverting input terminal (−) of the operational amplifier AMP or the node N6. The drain of the switch element Q13 is coupled to the node N5. The gate of the switch element Q13 is coupled to the output terminal of the operational amplifier AMP.

In the above-described configuration, the operational amplifier AMP controls an output of a voltage from the output terminal of the operational amplifier AMP (controls a state (an on state and an off state) of the switch element Q13) based on a voltage of the node N4 to be applied to the non-inverting input terminal (+) and a voltage of the node N6 to be applied to the inverting input terminal (−). Thereby, the operational amplifier AMP controls the voltage of the node N4 and the voltage of the node N6 to be equal.

The rest of the configuration is substantially the same as the configuration of the comparing part 11 according to the embodiment.

Since the operation according to the third modification is substantially the same as that according to the embodiment, descriptions thereof will be omitted.

According to the third modification, the operational amplifier AMP controls the voltage of the node N4 and the voltage of the node N6 to be equal. That is, the voltage of the drain of the switch element Q2 and the voltage of the drain of the switch element Q4 can be made equal. Thereby, in the current mirror circuit formed of the switch elements Q2 and Q4, the comparing part 11 can suppress an increase in errors in the electric currents I2 and IM. Thus, it is possible to suppress the output of an erroneous signal S.

2.4 Fourth Modification

Figure 5:
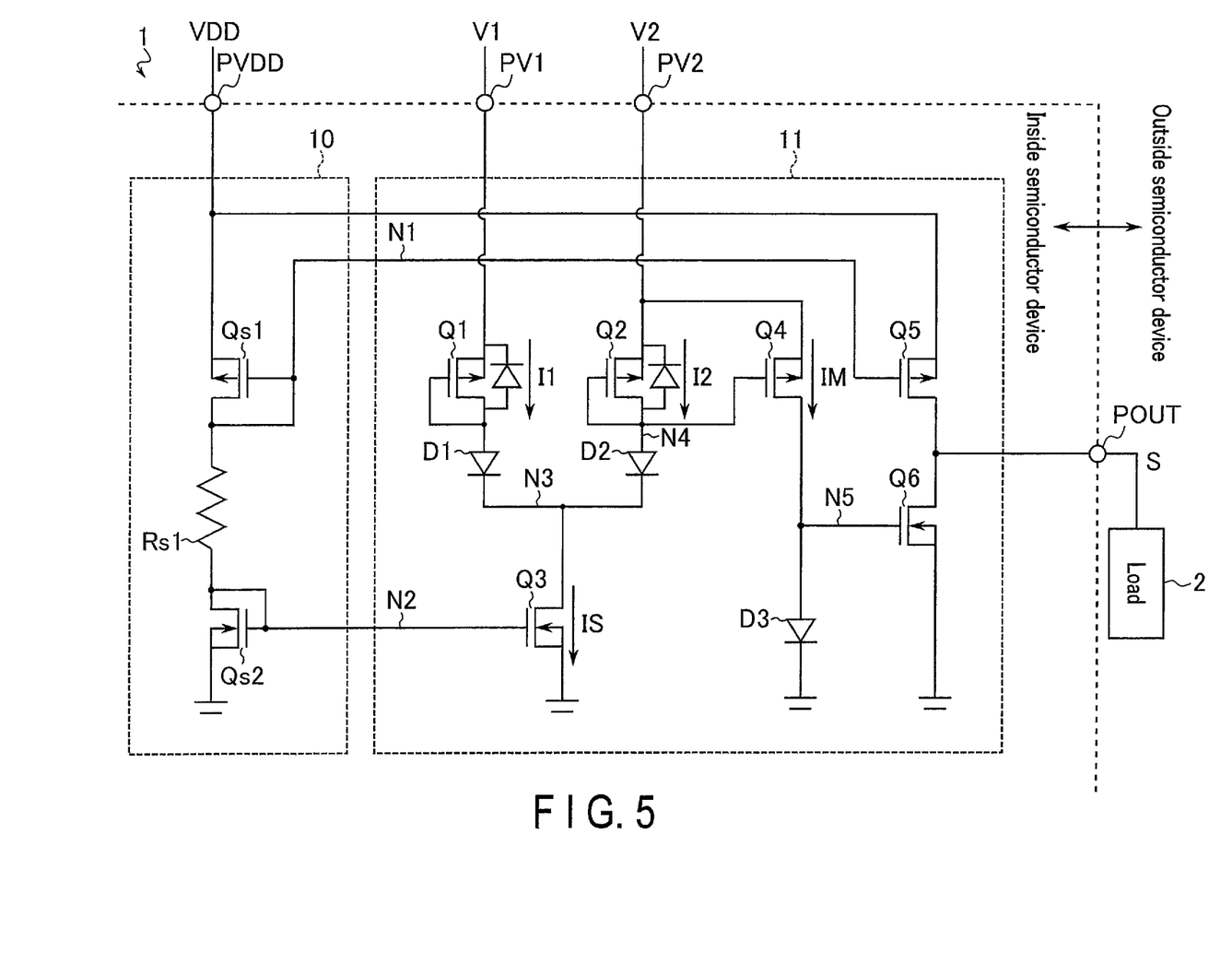
FIG. 5 is a circuit diagram explaining an example of a configuration of a semiconductor device according to a fourth modification.

In the above-described embodiment, a case in which the comparing part 11 includes the resistor E1 as a load has been described, but the present invention is not limited thereto. The comparing part 11 may include a diode instead of the resistor R1 as a load.

A configuration of the semiconductor device 1 according to a fourth modification will be described with reference to FIG. 5. FIG. 5 is a circuit diagram explaining an example of the configuration of the semiconductor device 1 according to the fourth modification. Note that since a configuration of the current source 10 of the semiconductor device 1 according to the fourth modification is the same as that of the embodiment, descriptions thereof will be omitted. In the following, descriptions will be given of a configuration of the comparing part 11 according to the fourth modification, focusing on points different from the configuration of the comparing part 11 according to the embodiment.

The comparing part 11 according to the fourth modification includes a diode D3.

The anode of the diode D3 is coupled to the node N5. The cathode of the diode D3 is grounded.

The rest of the configuration is substantially the same as the configuration of the comparing part 11 according to the embodiment, except that the resistor R1 is not included.

Since the operation according to the fourth modification is substantially the same as that according to the embodiment, descriptions thereof will be omitted.

With such a configuration as well, the same effects as those of the embodiment, first modification, second modification, and third modification can be exhibited.

2.5 Fifth Modification

Figure 6:
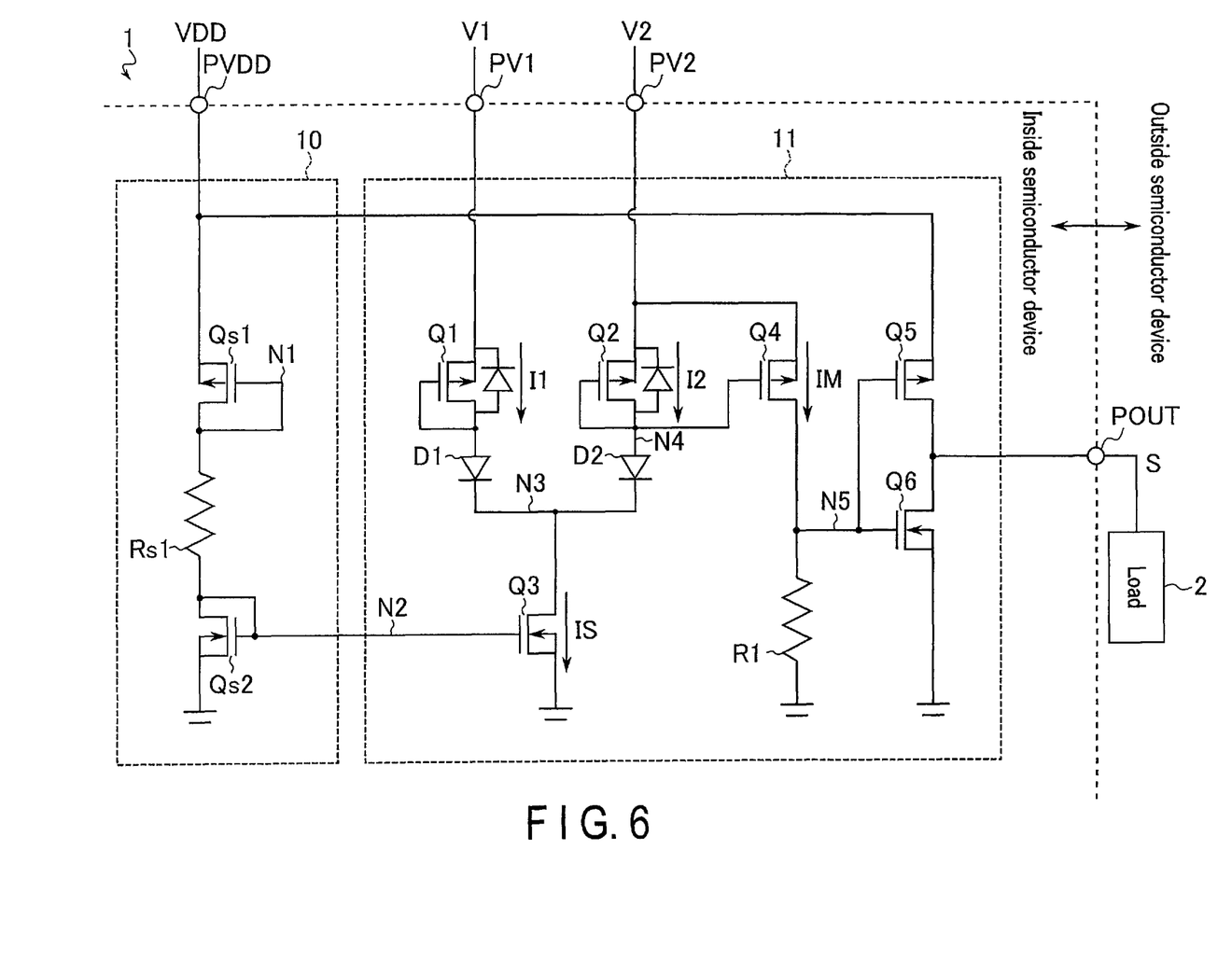
FIG. 6 is a circuit diagram explaining an example of a configuration of a semiconductor device according to a fifth modification.

In the above-described embodiment, first modification, second modification, third modification, and fourth modification, which signal S to be output from the terminal POUT is determined according to the state of the switch element Q6. However, the present invention is not limited thereto. The signal S to be output from the terminal POUT may be determined based on a state of the switch element Q5 in addition to the state of the switch element Q6.

A configuration of the semiconductor device 1 according to a fifth modification will be described with reference to FIG. 6. FIG. 6 is a circuit diagram explaining an example of the configuration of the semiconductor device 1 according to the fifth modification. In the following, descriptions will be given of the configuration of the semiconductor device 1 according to the fifth modification, focusing on points different from the configuration of the semiconductor device 1 according to the embodiment.

The gate of the switch element Q5 of the comparing part 11 according to the fifth modification is coupled to the node N5 instead of the current source 10. An absolute value of a threshold voltage of the switch element Q5 is equivalent to an absolute value of a difference between the voltage of the node N5 in the case where the electric current IM is a half of the constant current IS, and the voltage VDD. That is, in the case where the electric current IM is smaller than a half of the constant current IS, the switch element Q5 is turned on. In addition, in the case where the electric current IM is equal to or larger than a half of the constant current IS, the switch element Q5 is turned off.

The rest of the configuration is substantially the same as the configuration of the comparing part 11 according to the embodiment.

Next, the operation of the semiconductor device 1 according to the fifth modification will be described.

In the semiconductor device 1 according to the fifth modification, for example, in a case where the voltage V1 is higher than the voltage V2 (the electric current IM is smaller than a half of the constant current IS), the switch element Q5 is turned on, and the switch element Q6 is turned off. Thus, the voltage VDD is supplied to the terminal POUT via the switch element Q5, and an "H"-level signal S is output from the terminal POUT. In addition, in a case where the voltage V1 is equal to or lower than the voltage V2 (the electric current IM is equal to or larger than a half of the constant current IS), the switch element Q5 is turned off, and the switch element Q6 is turned on. Thus, the terminal POUT is grounded via the switch element Q6, and an "L"-level signal S is output from the terminal POUT.

The other operations are the same as those according to the embodiment.

With such a configuration as well, the same effects as those of the embodiment, first modification, second modification, third modification, and fourth modification can be exhibited.

2.6 Sixth Modification

Figure 7:
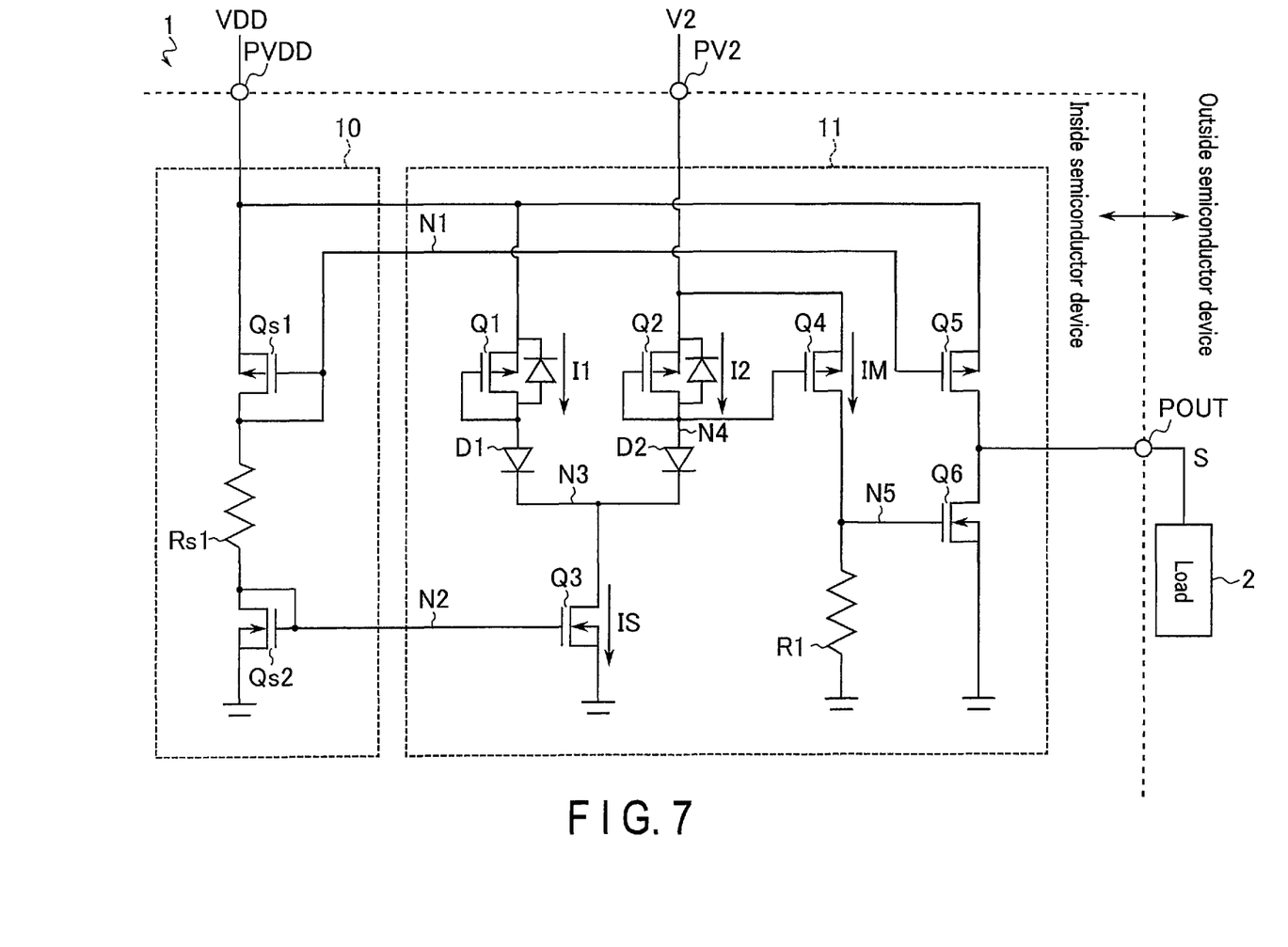
FIG. 7 is a circuit diagram explaining an example of a configuration of a semiconductor device according to a sixth modification.

In the above-described embodiment, first modification, second modification, third modification, fourth modification, and fifth modification, a case in which the heights of the voltages V1 and V2 are compared has been described, but the present invention is not limited thereto. The semiconductor device 1 may be formed, for example, to compare the heights of the voltages VDD and V2. That is, the semiconductor device determines the height of the voltage V2 based on the voltage VDD.

A configuration of a semiconductor device 1 according to a sixth modification will be described with reference to FIG. 7. FIG. 7 is a circuit diagram explaining an example of the configuration of the semiconductor device 1 according to the sixth modification. Note that since a configuration of the current source 10 of the semiconductor device 1 according to the sixth modification is the same as that of the embodiment, descriptions thereof will be omitted. In the following, descriptions will be given of a configuration of the comparing part 11 according to the sixth modification, focusing on points different from the configuration of the comparing part 11 according to the embodiment.

The source of the switch element Q1 of the comparing part 11 according to the sixth modification is coupled, together with the source of the switch element Q5, to the terminal PVDD of the current source 10. Thereby, the voltage VDD is applied to the source of the switch element Q1, instead of the voltage V1 in the embodiment.

Since the rest of the configuration is substantially the same as that of the comparing part 11 according to the embodiment, descriptions thereof will be omitted.

Next, the operation of the semiconductor device 1 according to the sixth modification will be described.

In the operation of the semiconductor device 1 according to the sixth modification, the voltage VDD and the voltage V2 are compared. The other operations are substantially the same as those according to the embodiment.

Thus, in a case where the voltage V2 is lower than the voltage VDD, an "H"-level signal S is output from the terminal POUT. In addition, in a case where the voltage V2 is equal to or higher than the voltage VDD, an "L"-level signal S is output from the terminal POUT.

With such a configuration as well, the same effects as those of the embodiment, first modification, second modification, third modification, fourth modification, and fifth modification can be exhibited.

2.7 Seventh Modification

Figure 8:
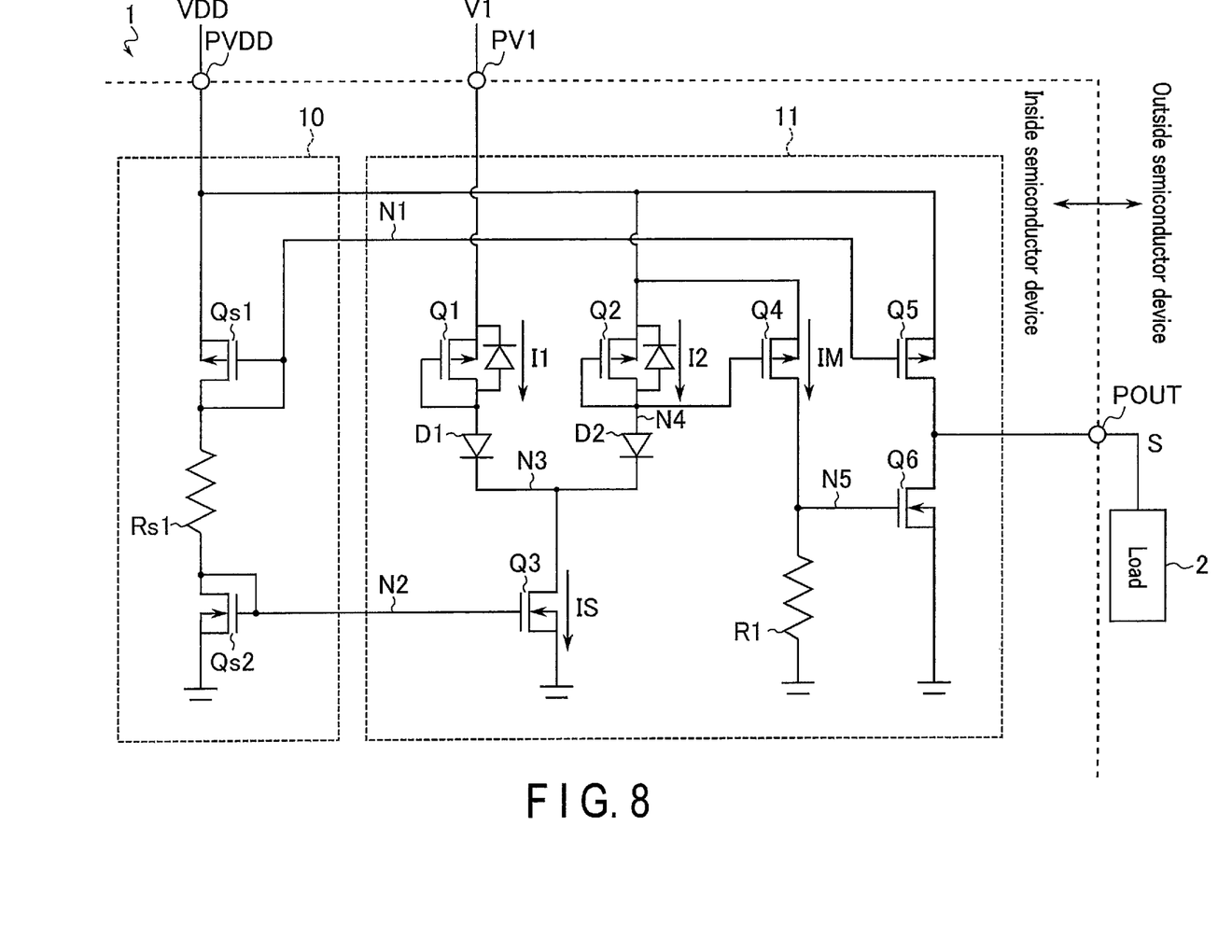
FIG. 8 is a circuit diagram explaining an example of a configuration of a semiconductor device according to a seventh modification.

In the sixth modification, a case in which the semiconductor device 1 compares the heights of the voltages VDD and V2 has been described, but the present invention is not limited thereto. The semiconductor device 1 may be formed so as to compare the heights of the voltages V1 and VDD. That is, the semiconductor device determines the height of the voltage V1 based on the voltage VDD.

A configuration of a semiconductor device 1 according to a seventh modification will be described with reference to FIG. 8. FIG. 8 is a circuit diagram explaining an example of the configuration of the semiconductor device 1 according to the seventh modification. Note that since a configuration of the current source 10 of the semiconductor device 1 according to the seventh modification is the same as that of the embodiment, descriptions thereof will be omitted. In the following, descriptions will be given of a configuration of the comparing part 11 according to the seventh modification, focusing on points different from the configuration of the comparing part 11 according to the embodiment.

The source of the switch element Q2 of the comparing part 11 according to the seventh modification is coupled to the terminal PVDD of the current source 10. Thereby, the voltage VDD is applied to the source of the switch element Q2, instead of the voltage V2 in the embodiment.

Since the rest of the configuration is substantially the same as that of the comparing part 11 according to the embodiment, descriptions thereof will be omitted.

Next, the operation of the semiconductor device 1 according to the seventh modification will be described.

In the operation of the semiconductor device 1 according to the seventh modification, the voltage V1 and the voltage VDD are compared. The other operations are substantially the same as those according to the embodiment.

Thereby, in a case where the voltage V1 is higher than the voltage VDD, an "H"-level signal S is output from the terminal POUT. In addition, in a case where the voltage V1 is equal to or lower than the voltage VDD, an "L"-level signal S is output from the terminal POUT.

With such a configuration as well, the same effects as those of the embodiment, first modification, second modification, third modification, fourth modification, fifth modification, and sixth modification can be exhibited.

3. Others

Note that in the above-described embodiment and first to seventh modifications, a case in which current-voltage characteristics, gate lengths, and channel widths of the switch elements Q1, Q2, and Q4 are equivalent to one another has been described as an example, but the present invention is not limited thereto. The current-voltage characteristics, gate length, and channel width of the switch element Q4 may be different from those of each of the switch elements Q1 and Q2. In this case, the electric current IM flowing through the switch element Q4 is a multiple (excluding a multiple of 1×; i.e., excluding equivalence) of the electric current I2 flowing through the switch element Q2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a first switch element including a first end to which a first voltage is applied, and a second end and a gate electrically coupled to a first node;
a second switch element including a first end to which a second voltage is applied, and a second end and a gate electrically coupled to the first node;

a third switch element including a first end to which the second voltage is applied, a second end electrically coupled to a second node, and a gate coupled to the first node;
a first current source electrically coupled to the first node;
a first element electrically coupled to the second node;
a fourth switch element including a gate coupled to the second node; and
a first terminal electrically coupled to a first end of the fourth switch element and outputting a signal based on a voltage of the second node,
wherein the first element is a first resistor including a first end coupled to the second node.

2. The device of claim 1, further comprising:
a first diode provided between the first switch element and the first node, and including an anode coupled to the second end and the gate of the first switch element and a cathode coupled to the first node; and
a second diode provided between the second switch element and the first node, and including an anode coupled to the second end and the gate of the second switch element and the gate of the third switch element and a cathode coupled to the first node.

3. The device of claim 1, wherein
the first end of the first switch element is a source, and the second end of the first switch element is a drain,
the first end of the second switch element is a source, and the second end of the second switch element is a drain, and
the first end of the third switch element is a source, and the second end of the third switch element is a drain.

4. The device of claim 3, further comprising:
a fifth switch element provided between the first switch element and the first node, and including a drain coupled to the drain of the first switch element and a source and a gate coupled to the first node together with the gate of the first switch element;
a sixth switch element provided between the second switch element and the first node, and including a drain coupled to the drain of the second switch element and a source and a gate coupled to the first node together with the gate of the second switch element; and
a seventh switch element provided between the third switch element and the second node, and including a drain coupled to the drain of the third switch element, a gate coupled to the first node together with the gate of the third switch element, and a source coupled to the second node.

5. The device of claim 3, further comprising:
an eighth switch element including a source coupled to the source of the first switch element, a gate coupled to the first node together with the gate of the first switch element, and a drain to which the first voltage is applied;
a ninth switch element including a source coupled to the source of the second switch element, a gate coupled to the first node together with the gate of the second switch element, and a drain to which the second voltage is applied; and
a tenth switch element including a source coupled to the source of the third switch element, a gate coupled to the first node together with the gate of the third switch element, and a drain to which the second voltage is applied.

6. The device of claim 1, further comprising:
an eleventh switch element including a first end coupled to the second end of the third switch element, a gate, and a second end coupled to the second node; and
an operational amplifier including an inverting input terminal coupled to the second end of the third switch element and the first end of the eleventh switch element, a non-inverting input terminal coupled to the first node, and an output terminal coupled to the gate of the eleventh switch element.

7. The device of claim 1, further comprising a twelfth switch element including a first end, a gate, and a second end coupled to the first terminal.

8. The device of claim 7, wherein the gate of the twelfth switch element is coupled to the second node.

9. The device of claim 7, wherein the first end of the first switch element or the first end of the second switch element is coupled to the first end of the twelfth switch element.

10. The device of claim 1, wherein the first end of the fourth switch element is a drain, and the second end of the fourth switch element is a source.

11. The device of claim 7, wherein the first end of the twelfth switch element is a source, and the second end of the twelfth switch element is a drain.

12. The device of claim 1, wherein the first current source is a thirteenth switch element including a first end coupled to the first node.

13. The device of claim 12, wherein the first end of the thirteenth switch element is a drain, and a second end of the thirteenth switch element is a source.

14. A semiconductor device comprising:
a first switch element including a first end to which a first voltage is applied, and a second end and a gate electrically coupled to a first node;
a second switch element including a first end to which a second voltage is applied, and a second end and a gate electrically coupled to the first node;
a third switch element including a first end to which the second voltage is applied, a second end electrically coupled to a second node, and a gate coupled to the first node;
a first current source electrically coupled to the first node;
a first element electrically coupled to the second node;
a fourth switch element including a gate coupled to the second node; and
a first terminal electrically coupled to a first end of the fourth switch element and outputting a signal based on a voltage of the second node,
wherein the first element is a third diode including an anode coupled to the second node.

15. The device of claim 14, further comprising:
a first diode provided between the first switch element and the first node, and including an anode coupled to the second end and the gate of the first switch element and a cathode coupled to the first node; and
a second diode provided between the second switch element and the first node, and including an anode coupled to the second end and the gate of the second switch element and the gate of the third switch element and a cathode coupled to the first node.

16. The device of claim 14, wherein
the first end of the first switch element is a source, and the second end of the first switch element is a drain,
the first end of the second switch element is a source, and the second end of the second switch element is a drain, and the first end of the third switch element is a source, and the second end of the third switch element is a drain.

17. The device of claim 16, further comprising:
a fifth switch element provided between the first switch element and the first node, and including a drain coupled to the drain of the first switch element and a source and a gate coupled to the first node together with the gate of the first switch element;
a sixth switch element provided between the second switch element and the first node, and including a drain coupled to the drain of the second switch element and a source and a gate coupled to the first node together with the gate of the second switch element; and
a seventh switch element provided between the third switch element and the second node, and including a drain coupled to the drain of the third switch element, a gate coupled to the first node together with the gate of the third switch element, and a source coupled to the second node.

18. The device of claim 16, further comprising:
an eighth switch element including a source coupled to the source of the first switch element, a gate coupled to the first node together with the gate of the first switch element, and a drain to which the first voltage is applied;
a ninth switch element including a source coupled to the source of the second switch element, a gate coupled to the first node together with the gate of the second switch element, and a drain to which the second voltage is applied; and
a tenth switch element including a source coupled to the source of the third switch element, a gate coupled to the first node together with the gate of the third switch element, and a drain to which the second voltage is applied.

19. The device of claim 14, further comprising:
an eleventh switch element including a first end coupled to the second end of the third switch element, a gate, and a second end coupled to the second node; and
an operational amplifier including an inverting input terminal coupled to the second end of the third switch element and the first end of the eleventh switch element, a non-inverting input terminal coupled to the first node, and an output terminal coupled to the gate of the eleventh switch element.

20. The device of claim 14, further comprising a twelfth switch element including a first end, a gate, and a second end coupled to the first terminal.

21. The device of claim 20, wherein the gate of the twelfth switch element is coupled to the second node.

22. The device of claim 20, wherein the first end of the first switch element or the first end of the second switch element is coupled to the first end of the twelfth switch element.

23. The device of claim 14, wherein the first end of the fourth switch element is a drain, and the second end of the fourth switch element is a source.

24. The device of claim 20, wherein the first end of the twelfth switch element is a source, and the second end of the twelfth switch element is a drain.

25. The device of claim 14, wherein the first current source is a thirteenth switch element including a first end coupled to the first node.

26. The device of claim 25, wherein the first end of the thirteenth switch element is a drain, and a second end of the thirteenth switch element is a source.

* * * * *